United States Patent
Ren et al.

(10) Patent No.: US 12,319,998 B2
(45) Date of Patent: Jun. 3, 2025

(54) VACUUM COATING DEVICE

(71) Applicant: Baoshan Iron & Steel Co., Ltd., Shanghai (CN)

(72) Inventors: Sanbing Ren, Shanghai (CN); Junfei Fan, Shanghai (CN); Shanqing Li, Shanghai (CN); Chunwei Zhang, Shanghai (CN); Xiaoli Jin, Shanghai (CN)

(73) Assignee: Baoshan Iron & Steel Co., Ltd., Shanghai (CN)

( * ) Notice: Subject to any disclaimer, the term of this patent is extended or adjusted under 35 U.S.C. 154(b) by 436 days.

(21) Appl. No.: 17/763,423

(22) PCT Filed: Sep. 25, 2020

(86) PCT No.: PCT/CN2020/117881
§ 371 (c)(1),
(2) Date: Mar. 24, 2022

(87) PCT Pub. No.: WO2021/057920
PCT Pub. Date: Apr. 1, 2021

(65) Prior Publication Data
US 2022/0341026 A1 Oct. 27, 2022

(30) Foreign Application Priority Data
Sep. 26, 2019 (CN) .......................... 201910915430.9

(51) Int. Cl.
*C23C 14/24* (2006.01)
*C23C 14/22* (2006.01)
*C23C 14/56* (2006.01)

(52) U.S. Cl.
CPC .......... *C23C 14/243* (2013.01); *C23C 14/228* (2013.01); *C23C 14/56* (2013.01)

(58) Field of Classification Search
CPC ................ C23C 14/243; C23C 14/246; C23C 14/24–325
(Continued)

(56) References Cited

U.S. PATENT DOCUMENTS

| 4,552,092 A | 11/1985 | Yanagi et al. |
| 2009/0304906 A1 | 12/2009 | Suduo et al. |

(Continued)

FOREIGN PATENT DOCUMENTS

| BE | 1009317 A6 | 2/1997 |
| BE | 1009321 A6 | 2/1997 |

(Continued)

OTHER PUBLICATIONS

KR 10-0761084.*
(Continued)

*Primary Examiner* — Aiden Lee
(74) *Attorney, Agent, or Firm* — Barclay Damon LLP

(57) ABSTRACT

The present invention discloses a vacuum coating device, comprising: a crucible; an induction heater provided on the periphery of the crucible; a flow distribution box connected to the top of said crucible via a steam pipe. Wherein said flow distribution box is provided inside with a horizontal pressure stabilizing plate, said flow distribution box is connected on the top with a nozzle, said steam pipe is provided with a pressure regulating valve, and said pressure stabilizing plate has a multi-hole structure. The lower surface of said pressure stabilizing plate is connected to a horizontal flow suppression plate, and a space is formed between the side of said flow suppression plate and the inner wall of said flow distribution box. A jet moderating zone is formed between the joint where said flow distribution box and said steam pipe are connected and the lower surface of said pressure stabilizing plate, and a jet accelerating zone is (Continued)

formed between the upper surface of said pressure stabilizing plate and the joint where said flow distribution box and said nozzle are connected. When the high-temperature steam reaches the low-temperature steel plate, a uniform coating can be formed on the steel plate surface.

14 Claims, 6 Drawing Sheets

(58) Field of Classification Search
USPC .................................................. 118/726–727
See application file for complete search history.

(56) References Cited

U.S. PATENT DOCUMENTS

| | | | | |
|---|---|---|---|---|
| 2011/0000431 | A1* | 1/2011 | Banaszak | C23C 14/562 |
| | | | | 118/694 |
| 2018/0290168 | A1 | 10/2018 | Han et al. | |
| 2022/0356556 | A1* | 11/2022 | Ren | C23C 14/562 |
| 2023/0323526 | A1* | 10/2023 | Ren | C23C 14/243 |
| | | | | 427/250 |

FOREIGN PATENT DOCUMENTS

| | | | |
|---|---|---|---|
| CN | 101175866 | A | 5/2008 |
| CN | 103249860 | A | 8/2013 |
| CN | 105296932 | A | 2/2016 |
| CN | 207596942 | U | 7/2018 |
| CN | 109487216 | A | 3/2019 |
| CN | 109666897 | A | 4/2019 |
| EP | 1301649 | B1 | 4/2003 |
| JP | S59177370 | A | 10/1984 |
| JP | 2007070679 | A | 3/2007 |
| JP | 2010013731 | A | 1/2010 |
| JP | 2011127137 | A | 6/2011 |
| KR | 100761084 | B1 * | 9/2007 |
| KR | 20110035072 | A | 4/2011 |
| TW | 201614085 | A | 4/2016 |
| WO | 2008038821 | A1 | 4/2008 |
| WO | 2013122058 | A1 | 8/2013 |
| WO | 2016101397 | A1 | 6/2016 |
| WO | WO 2017/069369 | | 4/2017 |
| WO | WO 2018/020311 | A1 | 2/2018 |

OTHER PUBLICATIONS

English translation of KR-100761084.*
International Searching Authority/CN, International Search Report and Written Opinion of the International Searching Authority, Application No. PCT/CN2020/117881, date of mailing Dec. 15, 2020, 10 pages (with English translation of the International Search Report).
Extended European Search Report in Application No. 20867816.9 dated Sep. 29, 2022, 9 pages.
Decision to Grant in Japanese Application No. 2022-519382 dated May 30, 2024 [Japanese language version, with English translation of allowed claims], 5 pages.
Office Action in Korean Application No. 10-2022-7012746 dated Apr. 5, 2024 [with English translation], 5 pages.

* cited by examiner

VACUUM COATING DEVICE

CROSS-REFERENCE TO RELATED APPLICATIONS

This application is a national phase entry of Patent Cooperation Treaty Application PCT/CN2020/117881, filed Sep. 25, 2020, which in turn claims priority from Chinese Patent Application No. 201910915430.9 filed on Sep. 26, 2019. Each of the above-described applications is incorporated herein by reference in its entirety.

TECHNICAL FIELD

The present invention relates to the vacuum coating field and in particular to a vacuum coating device.

BACKGROUND

Physical vapor deposition (PVD) refers to a process technology of heating the metal to be coated under vacuum to deposit the metal in a gaseous manner on a base material to form a coating. PVD can be classified into electric heating PVD (resistance type or induction type), electron beam heating PVD (EBPVD) and other ways by heating methods. As a surface modification and coating process, vacuum coating has been widely used in electronics, glass, plastics, and other industries. The main advantages of the vacuum coating technology include environmental protection, good coating performance, and diversity of coating materials. The key to apply the vacuum coating technology to continuous strip steel includes several aspects such as continuous, large area, high speed, and large scale of coating production. Since the 1980s, the world's major iron and steel companies have conducted lots of research on this technology. With the maturity of hot-dip galvanizing and electro-galvanizing technologies, this technology has attracted unprecedented attention and is considered as an innovative surface coating process.

The key issue in the vacuum coating process is how to obtain a uniform coating with a consistent thickness through the arrangement of nozzles. At present, foreign published information mainly includes the following aspects:

1) Integrated structure of the Evaporation Crucible and the Flow Distribution Nozzle Applications BE1009321A6 and BE1009317A61 respectively disclose the crucible nozzle structures as shown in FIG. 1 and FIG. 2. In the structure of FIG. 1, an upper cover 2 is arranged on an upper part of a crucible 1, so that a nozzle structure is formed between the upper cover 2 and a furnace wall for the direct spray of evaporated metal. In the structure of FIG. 2, a filter plate 3 is additionally arranged in an evaporation crucible, and then metal steam is sprayed from a slit nozzle at the top. In the nozzle design processes of the two devices, one adopts a de Laval nozzle, and the other adopts a convergent nozzle. Regarding the orientation of the nozzles, one adopts the lateral spray, and the other adopts the vertical spray.

Applications JPS59177370A and U.S. Pat. No. 4,552,092A also disclose related evaporation crucible and nozzle structure. FIG. 3 illustrates a crucible nozzle structure with automatic replenishment of molten metal. A nozzle 4 uses a wide outlet, and a heater 5 is also arranged at an upper part of the crucible for heating the crucible. In the crucible nozzle structure shown in FIG. 4, the structure is spread by an arc 6 on one side, realizing lateral spraying; and a heating tube 7 is also arranged on the periphery of a crucible wall for heating the periphery surface.

2) Split Structure of the Evaporation Crucible and the Flow Distribution Nozzle

Application WO2018/020311A1 discloses a split crucible nozzle structure. As shown in FIG. 5, in the device, the bottom of the crucible is connected to a molten metal supply tank 8, and the upper part of the supply tank 8 conveys metal steam to a tubular distributor and a steam nozzle at the front end through a split pipeline 9; and then, the nozzle sprays the metal steam to a metal plate at a high speed.

Application CN103249860A discloses a split structure of a flow distributor and a nozzle. As shown in FIG. 6, steam is delivered into an upper horizontal pipe 10 through a vertical pipe. The horizontal pipe 10 is provided with a porous nozzle at the top to uniformly spray metal steam onto a surface of a metal plate.

Application CN101175866A discloses a metal steam flow distributor and a nozzle form. For a sectional form of a nozzle as shown in FIG. 7, a wire is wound outside a flow distributor pipe 11 to heat the pipe; and the nozzle has a square shell. As shown in FIG. 8, a ringlike pipe made from another material is nested inside a square shell 12 and is used for spraying the metal steam. The steam outlet of the nozzle is porous.

The above-mentioned applications all relate to the specific forms of nozzles. However, not all of these nozzles can achieve sufficient uniform coating. For example, as shown in FIG. 6 and FIG. 7, since small holes of the nozzle are spaced round holes, after high-pressure gas is sprayed along the small holes, radial round spots are formed. In the movement process of a steel plate, if the round spots do not overlap each other, it is very easy to form a long-strip-shaped coating. On the other hand, if the round spots are too close to each other, the overlapped part of the round spots is easy to form a thicker coating, while the non-overlapped part forms a thinner coating, which leads to uneven coating of the steel plate. However, the uniformity of the coating on the steel plate surface plays a key role in the subsequent use of the steel plate such as bending and stamping.

SUMMARY

In order to solve the above-mentioned defects in the prior art, the present invention aims to provide a vacuum coating device, which can form uniform jet stream. When the high-temperature steam reaches the low-temperature steel plate, a uniform coating can be formed on the steel plate surface.

In order to achieve the foregoing objective, the present invention provides the following technical solutions.

A vacuum coating device, comprising: a crucible; an induction heater provided on the periphery of the crucible; a flow distribution box connected to the top of said crucible via a steam pipe, wherein said flow distribution box is provided inside with a horizontal pressure stabilizing plate, said flow distribution box is connected on the top with a nozzle, said steam pipe is provided with a pressure regulating valve.

Said pressure stabilizing plate has a multi-hole structure. The vacuum device further comprises a flow suppression plate, which is connected to the lower surface of said pressure stabilizing plate. Said flow suppression plate is also set to be horizontal, and a space is formed between the side of said flow suppression plate and the inner wall of said flow distribution box.

A jet moderating zone is formed between the joint where said flow distribution box and said steam pipe are connected and the lower surface of said pressure stabilizing plate, and a jet accelerating zone is formed between the upper surface of said pressure stabilizing plate and the joint where said flow distribution box and said nozzle are connected.

Since the metal steam ejected from the steam pipe is mainly concentrated in the middle area of the pressure stabilizing plate, the ejected steam cannot to be evenly distributed on the steel plate. By adopting the above-mentioned technical solution, the steam concentrated directly below the pressure stabilizing plate is diverted to the edge area of the pressure stabilizing plate by means of a flow suppression plate attached to the lower surface of the pressure stabilizing plate to block the outlet of the steam pipe. Then the steam is redistributed in the jet moderating zone and uniformly ejected through the holes of the pressure stabilizing plate to the jet accelerating zone. The steam in the jet accelerating zone further defines the jet path through the nozzle, so that the metal steam is ejected in the width direction of the steel plate and distributed evenly over the plate.

The pressure stabilizing plate has a T-shaped section, the ends along the horizontal direction of said pressure stabilizing plate are connected to the inner wall of said flow distribution box, the end along the vertical direction of said pressure stabilizing plate is connected to said flow suppression plate. Wherein, the pressure stabilizing plate and the flow suppression plate can be formed integrally or separately, as long as the end along the vertical direction of said pressure stabilizing plate is connected to the middle of the flow suppression plate, that is, the top of the pressure stabilizing plate extends along the horizontal direction and its bottom is connected to the flow suppression plate. In this technical solution, the longitudinal section of the pressure stabilizing plate and the flow suppression plate is I-shaped, they are simple in structure and easy to manufacture.

Further, the flow suppression plate can be in various shapes, such as rectangular, circular, triangular, trapezoidal, etc., as long as it is able to redistribute the steam from the steam pipe into the flow distribution box.

In one of the technical solutions of this application, the flow suppression plate is rectangular, a space D between one pair of opposite sides of said flow suppression plate and the inner wall of said flow distribution box is 0.1~5 mm. For example, in this technical solution, four side walls of the pressure stabilizing plate are connected to the inner wall of the flow distribution box, and the flow suppression plate located below the pressure stabilizing plate is not connected to the inner wall of the flow distribution box. The flow suppression plate is rectangular, a space D between one pair of opposite sides (the opposite sides of the flow suppression plate shown in FIG. 9 in the width direction) of the flow suppression plate and the inner wall of said flow distribution box is D is 0.1~5 mm. If the space is less than 0.1 mm, it will increase the assembly difficulty of the resistant materials and will not play a role in allowing the steam to pass through. If the space is greater than 5 mm, the steam will still be too concentrated in the middle of the pressure stabilizing plate (≥60%) and too little on both sides, which cannot achieve the uniform distribution of the steam. the ratio of a space between the other pair of opposite sides of the flow suppression plate (or the length of the flow suppression plate) to the length of the flow distribution box inner wall is 0.1~0.4. If the ratio is less than 0.1, the flow suppression plate is too small and the steam on its sides is too large, while if the ratio is greater than 0.4, the steam distribution in the central region is too small.

Further, wherein the ratio of the volume of the jet moderating zone V1 to the volume of the jet accelerating zone V2 is 1~5. If the ratio of V1 to V2 is less than 1, the steam distribution in jet moderating zone is inadequate, and the effective utilization area in the jet accelerating zone is reduced. If the ratio of V1 to V2 is too great, for example, if the ratio is greater than 5, the velocity of the steam in the jet accelerating zone is reduced, resulting in insufficient steam acceleration.

Holes in the pressure stabilizing plate are rectangular, circular or triangular in shape, or the holes may be of any polygon or circle in shape. The holes of the pressure stabilizing plate run in linear, curvilinear direction or have a multilayer structure along a rising direction of the steam. Since the pressure stabilizing plate has a certain thickness, the direction of the holes refers to a path where the steam passes through the thickness direction of the pressure stabilizing plate. That is, when the steam passes through the pressure stabilizing plate, the distribution of the steam may be changed through the position distribution of the holes in the pressure stabilizing plate; and a rising path of the steam may also be changed through the direction of the holes. The multilayer structure refers to a structure where the steam is guided, by the direction of the holes, to raise in steps, for example, air flow steps formed by multiple groups of fold lines. The structure may increase the resistance of the pressure stabilizing plate to the air flow, but can make the steam be distributed more uniformly.

Said nozzle has a nozzle outlet. The nozzle outlet described here is the orifice from which steam is emitted. The ratio of the total area of holes on said pressure stabilizing plate $S_{holes}$ to the area of said nozzle outlet $S_{outlet}$ is greater than or equal to 0.1, that is, $S_{holes}/S_{outlet} \geq 0.1$. The pressure and speed of the nozzle outlet may be adjusted according to the ratio of the areas. When the ratio is less than 0.1, the speed of air passing through the nozzle outlet is too low, thereby reducing the adhesion force of the coating. Further, $S_{holes}/S_{outlet} \leq 10$. When the ratio is greater than 10, energy dissipation occurs, which results in incapability of a significant increase in the speed of the air flow at the nozzle outlet.

The nozzle outlet is of a slit shape or multi-hole, and a ratio of the area of the nozzle outlet $S_{outlet}$ to an area of a joint of the steam pipe and the top of the crucible $S_{inlet}$ is 0.05~5. If the ratio is less than 0.05, the spray flow rate of the steam is too small, which cannot meet the coating thickness requirement. If the ratio is too large, for example, if the ratio is greater than 5, the speed of the steam at the nozzle outlet may be extremely low, which results in a decrease in coating adhesion.

In this technical solution, the nozzle extends in a straight line along the length of the pressure stabilizing plate and is located parallel to the mid-fold of the pressure stabilizing plate and above the pressure stabilizing plate. Moreover, the width of the nozzle usually corresponds to the width of the steel plate to be coated.

The nozzle outlet is a linear slit or a curvilinear slit.

The multi-hole outlet is rectangular, round or trapezoidal in shape.

Preferably, the nozzle is made of materials that are resistant to high temperatures, wear and can be processed. For example, the nozzle is made of graphite, ceramic or inert metals.

The present invention discloses a vacuum coating device having a flow suppression nozzle, where the metal steam is obtained by melting and evaporating the metal material in the crucible. The metal steam enters the flow distribution box, the flow distribution box is arranged with a flow suppression plate and a pressure stabilizing plate, and the flow direction of the metal steam is changed after passing through the flow suppression plate, which facilitates the initial distribution of the steam. The metal steam continues to be buffered by the pressure stabilizing plate in the flow chamber, and the metal vapor is further equalized. When the metal steam passes through the pressure stabilizing plate and is ejected from the nozzle, a uniform jet stream forms. When the high-temperature steam contacts with the low-temperature steel plate, a uniform coating is formed on the steel plate surface, and the quality of vacuum coated steel plate is improved. The present invention is low cost, simple to operate, and can be exported in sets with vacuum coating technology in the future.

DETAILED DESCRIPTION OF THE EMBODIMENTS

The technical solutions of the present invention are further described below with reference to the accompanying drawings and embodiments.

Figure 1:
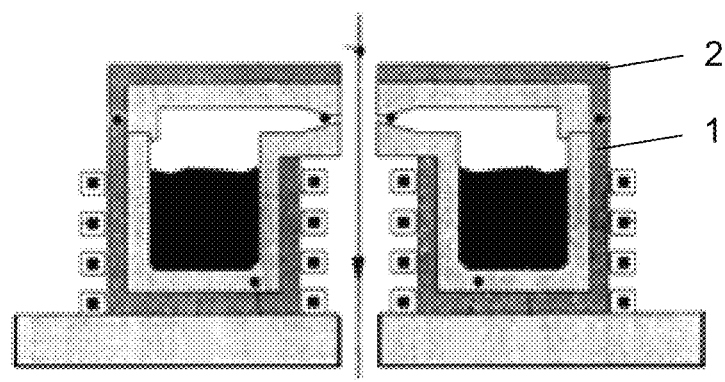
FIG. 1 is a schematic diagram of application BE1009321A6.
Figure 2:
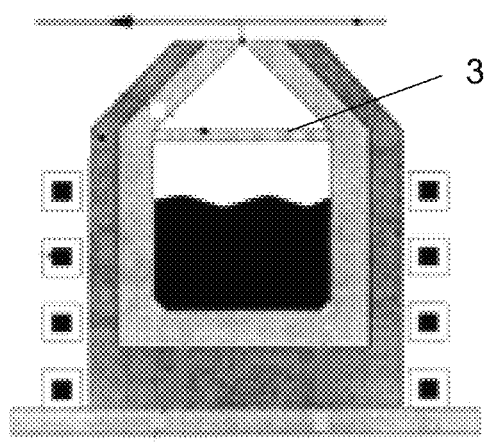
FIG. 2 is a schematic diagram of application BE1009317A61.
Figure 3:
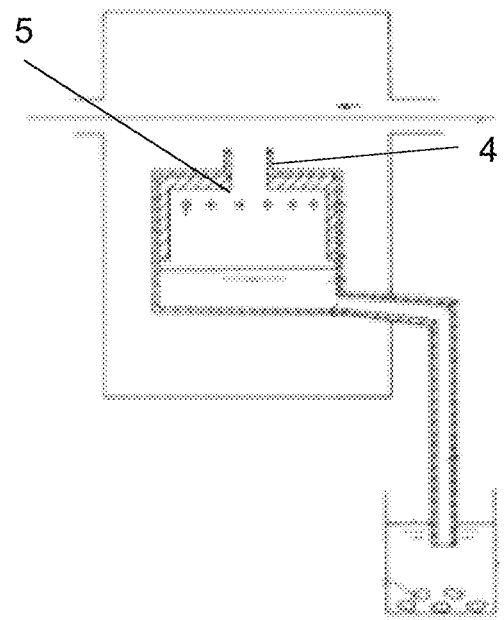
FIG. 3 is a schematic diagram of application JPS59177370A.
Figure 4:
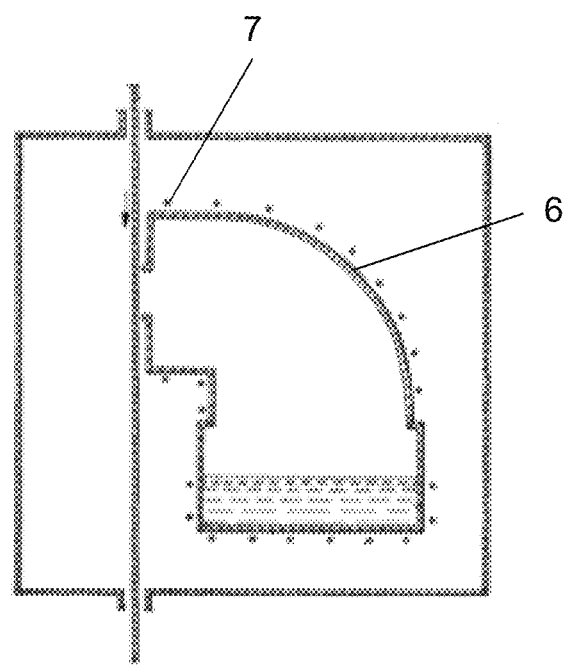
FIG. 4 is a schematic diagram of application U.S. Pat. No. 4,552,092A.
Figure 5:
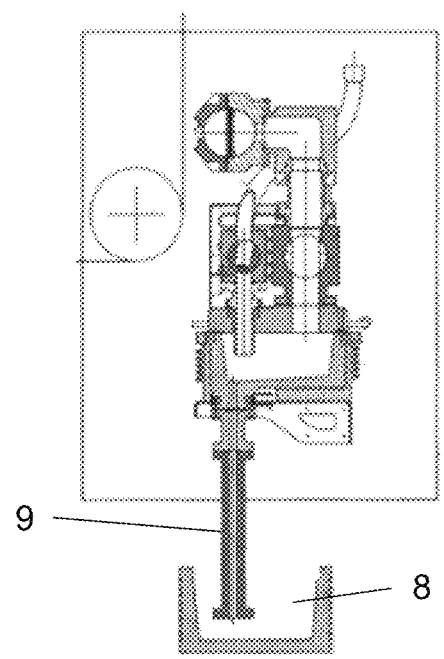
FIG. 5 is a schematic diagram of application WO2018/020311A1.
Figure 6:
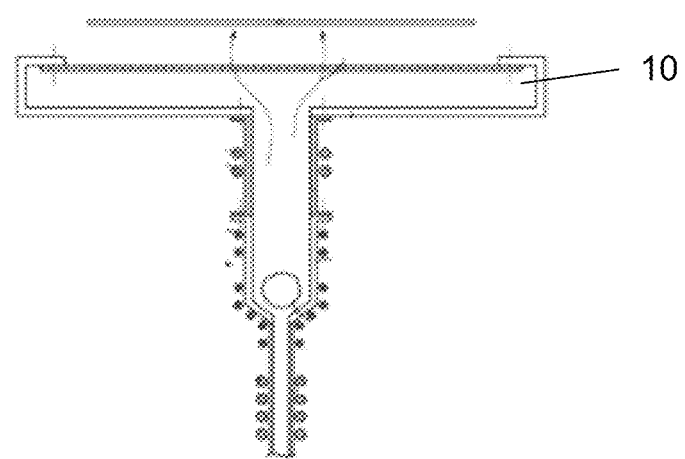
FIG. 6 is a schematic diagram of application CN103249860A.
Figure 7:
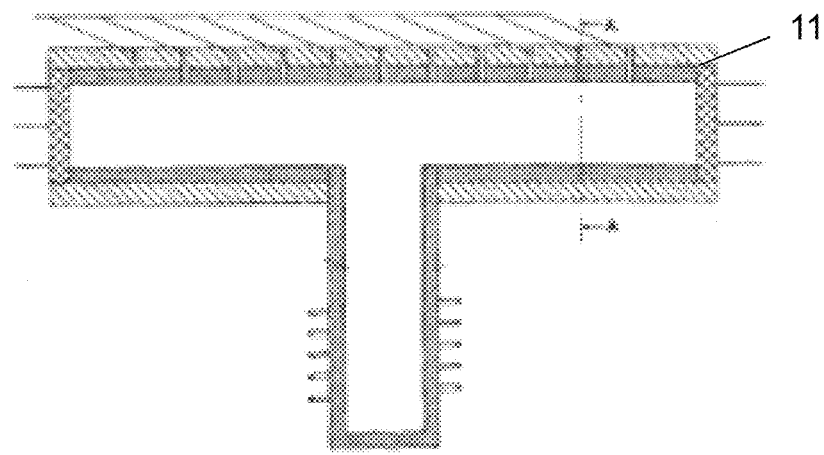
FIG. 7 is a schematic diagram of application CN101175866A.
Figure 8:
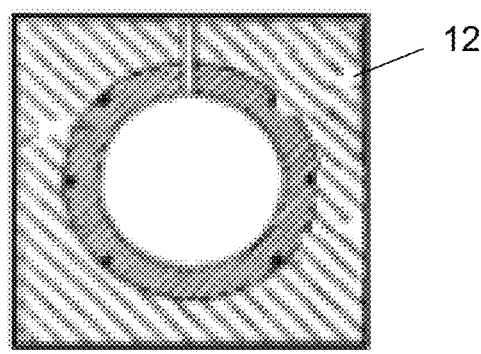
FIG. 8 is a schematic diagram of the square shell in FIG. 7.
Figure 9:
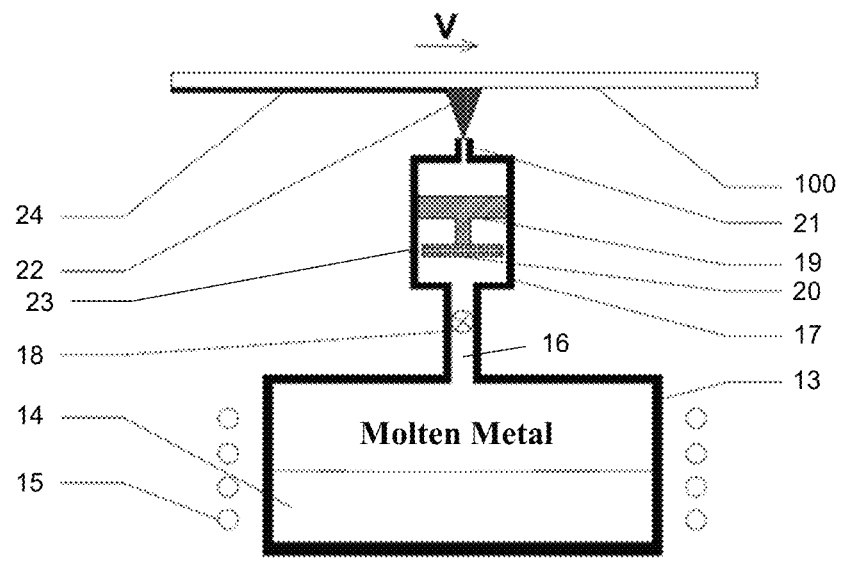
FIG. 9 is a cutaway view of the vacuum coating device of the present invention in the width direction.
Figure 10:
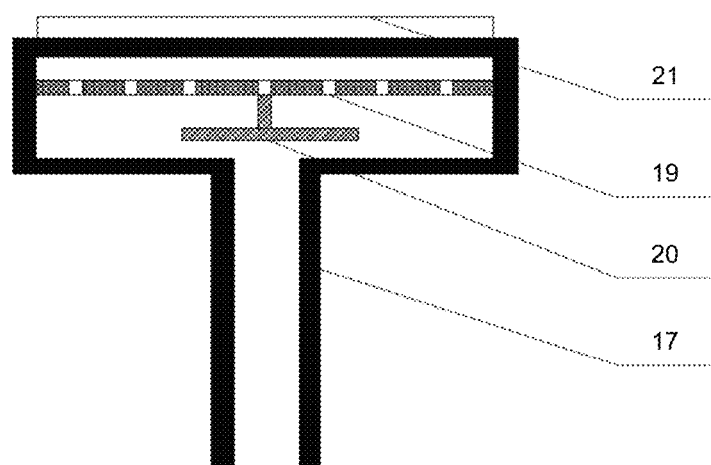
FIG. 10 is a cutaway view of the flow distribution box in the vacuum coating device of FIG. 9 in the length direction.
Figure 11:
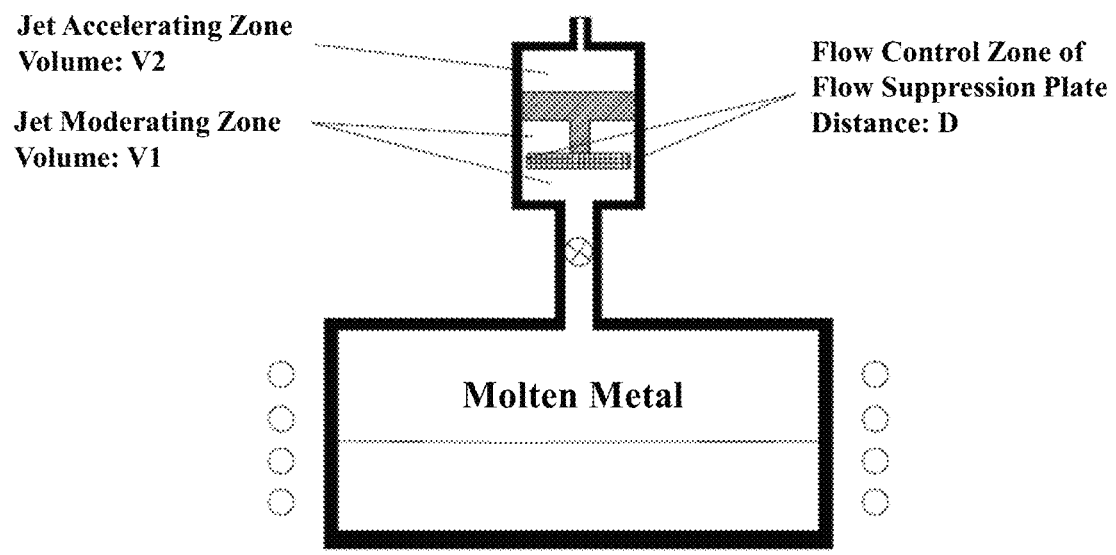
FIG. 11 is a schematic diagram of the distribution of the zones in the vacuum coating device of FIG. 9 (width direction)
Figure 12:
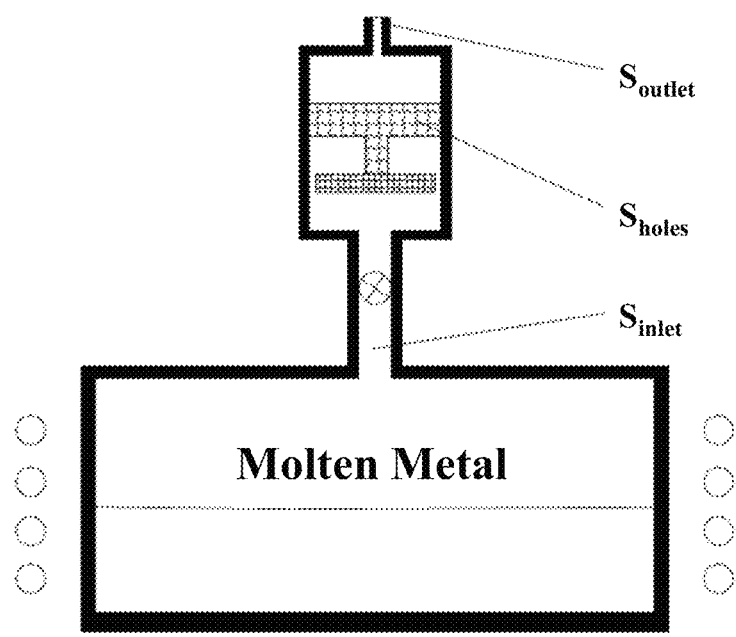
FIG. 12 is a schematic diagram of the area classification of parameters in the vacuum coating device of FIG. 9 (width direction).

Referring to FIG. 9 to FIG. 12, the present invention provides a vacuum coating device. The vacuum coating device comprises a crucible 13. The crucible 13 contains molten metal 14. An induction heater 15 is arranged on the periphery of the crucible 13. The top of the crucible 13 is connected to a flow distribution box 17 via a steam pipe 16. A pressure regulating valve 18 is arranged in steam pipeline 16. A horizontal pressure stabilizing plate 19 is arranged in said flow distribution box 17. Said pressure stabilizing plate 19 has a T-shaped section, the ends along the horizontal direction of said pressure stabilizing plate 19 are connected to the inner wall of said flow distribution box 17, the end along the vertical direction of said pressure stabilizing plate 19 is connected to a flow suppression plate 20. The top of the flow distribution box 17 is connected to a nozzle 21.

Preferably, said pressure stabilizing plate 19 has multi-hole structure, and the holes in said pressure stabilizing plate can be in various shapes, such as rectangular, circle or triangular. Those holes run in linear, curvilinear direction or have a multilayer structure. The ratio of the total area of holes on said pressure stabilizing plate 19 $S_{holes}$ to the area of said nozzle outlet $S_{outlet}$ is 0.1 or more, and is 10 or less simultaneously, that is, $0.1 \leq S_{holes}/S_{outlet} \leq 10$.

Preferably, a jet moderating zone is formed between the joint where said flow distribution box 17 and said steam pipe 16 are connected (that is, the inlet of the flow distribution box 17, the area of the joint is denoted as $S_{inlet}$) and the lower surface of said pressure stabilizing plate 19, the volume of the jet moderating zone is V1. A jet accelerating zone is formed between the upper surface of said pressure stabilizing plate 19 and the joint where said flow distribution box 17 and said nozzle 21 are connected (that is, the outlet of the flow distribution box 17), the volume of the jet accelerating zone is V2.

Preferably, said flow suppression plate 20 is also arranged in the horizontal direction, a space between one pair of opposite sides of the flow suppression plate (the pair of opposite sides along the width direction in FIG. 9) and the inner walls of said flow distribution box 17 is D. The flow suppression plate 20 can be in various shapes, such as rectangular, circular, triangular, trapezoidal, etc., its main function is to redistribute the steam from the steam pipe 16 into the jet moderating zone. The redistributed steam enters the pressure stabilizing plate 19 and then enters the jet accelerating zone through the holes of the pressure stabilizing plate 19, thus indirectly extending the movement path of the steam and achieving a quite uniform distribution before entering the pressure stabilizing plate 19.

Preferably, said nozzle 21 has a nozzle outlet, said nozzle outlet is of a slit shape or multi-hole. Nozzle outlet is of a linear slit or a curvilinear slit, and the multi-hole type outlet is rectangular, round or trapezoidal in shape. The ratio of the area of nozzle outlet to the area of a joint of the top of crucible is 0.05~5.

Preferably, said nozzle 21 operates with an internal pressure of 500~500,000 Pa.

Preferably, said nozzle 21 is made of graphite, ceramic or inert metals, as well as other materials that can be processed.

Preferably, said molten metal 14 contains metals such as zinc, magnesium, aluminum, tin, nickel, copper, iron, etc., in addition to low melting point (below 2000° C.) oxides of these metals.

Preferably, the steel plate 100 is cleaned by plasma or other devices before vacuum coating, and the preheating temperature reaches 80~300° C.

The specific steps for using the vacuum coating device of the present invention are as follows.

1) Solid metal is melted into molten metal 14 in the crucible 13 by the induction heater 15, and then the molten metal 14 begins to vaporize at a high overheat temperature and low pressure, gradually forming the metal steam 22.

2) In the beginning phase, the pressure regulating valve 18 arranged in the steam pipe 16 connected to the crucible 13 is closed. As the molten metal 14 continuously vaporizes, the steam pressure of an inner chamber of the crucible 13 continuously increases. When the inner chamber of the crucible 13 reaches a certain pressure (for example, 5000~500,000 Pa), the pressure regulating valve 18 is opened to ensure constant pressure output. Meanwhile, the power of the induction heater 15 is increased to compensate for the reduced pressure due to the opening of the pressure regulating valve 18; and the power range of the induction heater 15 is adjusted to keep the pressure of the inner chamber of the crucible 13 to be within a certain range.

3) After the pressure regulating valve 18 is opened, the metal steam 22 flows along the steam pipeline 16. When entering into the flow distribution box 17, due to the restriction of the flow suppression plate 20, the original direction of steam flowing out of the steam pipe is changed, with most of the steam distributing from both sides of the flow suppression plate 20 (the periphery of the flow suppression plate in the length direction, see FIG. 10), and there is another part of the steam passing through the flow control zone 23 (that is, the periphery of the flow suppression plate in the width direction, see FIG. 9) into the jet moderating zone.

After that, the pressure of the high-velocity stream formed by the metal steam is reduced due to the restriction of the pressure stabilizing plate 19. And the steam flows uniformly along the holes in the pressure stabilizing plate 19 and subsequently flows uniformly from the nozzle at the top of the flow distribution box 17.

4) Due to the narrow outlet of the nozzle, the metal steam 22 flows out at a large speed. At this time, a moving steel plate 100 is arranged above the nozzle outlet, the temperature of the metal steam 22 is high, when the metal steam reaches the low-temperature steel plate 100, it solidifies rapidly, forming a metal coating 24.

Embodiment

The steel plate 100 is galvanized, and the width of the steel plate 100 is 1,000 mm. After cleaning and drying, the steel plate 100 is heated to 120° C. Zinc on steel plate surface is vaporized by the induction heater 15, and then adjust the power of the induction heater to raise the pressure in the crucible 13 to 20,000 Pa, and the pressure regulating valve 18 is closed before that. When the pressure in the crucible 13 reaches 20,000 Pa, the pressure regulating valve 18 is opened, and then the metal steam 22 enters into the flow distribution box 17 through the steam pipe 16. The flow suppression plate 20 is rectangular, wherein V1/V2=2, D=1 mm. The pressure stabilizing plate 19 has multi-hole structure, $S_{holes}/S_{outlet}=3$, the pressure in nozzle 21 is 5,000 Pa. The nozzle 21 is made of graphite, and the nozzle outlet is of a rectangular slit. $S_{outlet}/S_{inlet}=0.95$.

Those of ordinary skill in the art should realize that the above embodiments are only used to illustrate the present invention, but not used to limit the present invention. Changes and modifications made to the above embodiments without departing from the essential spirit scope of the present invention shall all fall within the scope of the claims of the present invention.

What is claimed is:

1. A vacuum coating device, comprising:
a crucible;
an induction heater provided on a periphery of the crucible;
a flow distribution box connected to a top of the crucible via a steam pipe, wherein the flow distribution box is provided inside with a horizontal pressure stabilizing plate, a top of the flow distribution box is connected with a nozzle, the steam pipe is provided with a pressure regulating valve;
the pressure stabilizing plate has a multi-hole structure, a lower surface of the pressure stabilizing plate is connected to a horizontal flow suppression plate, and a space is formed between a side of the flow suppression plate and an inner wall of the flow distribution box;
a jet moderating zone is formed between a joint where the flow distribution box and the steam pipe are connected and the lower surface of the pressure stabilizing plate, and a jet accelerating zone is formed between an upper surface of the pressure stabilizing plate and a joint where the flow distribution box and the nozzle are connected,
wherein the pressure stabilizing plate has a T-shaped section, wherein ends along a horizontal direction of the pressure stabilizing plate are connected to the inner wall of the flow distribution box, and an end along a vertical direction of the pressure stabilizing plate is connected to the flow suppression plate, and
wherein the flow suppression plate is rectangular, a distance (D) of the space between the side of the flow suppression plate and the inner walls of the flow distribution box is 0.1~5 mm.

2. The vacuum coating device of claim 1, wherein a ratio of a volume of the jet moderating zone ($V_1$) to a volume of the jet accelerating zone ($V_2$) is 1~5.

3. The vacuum coating device of claim 1, wherein the holes in the pressure stabilizing plate are rectangular, circle or triangular in shape, and run in linear, curvilinear direction or in a multilayer structure.

4. The vacuum coating device of claim 3, wherein the nozzle has a nozzle outlet, a ratio of a total area of holes on the pressure stabilizing plate ($S_{holes}$) to an area of the nozzle outlet ($S_{outlet}$) is 0.1 or more, that is, $S_{holes}/S_{outlet} \geq 0.1$.

5. The vacuum coating device of claim 4, wherein the nozzle outlet is of a slit shape or multi-hole, and the ratio of an area of the nozzle outlet ($S_{outlet}$) to an area of a joint between the steam pipe and the top of the crucible ($S_{inlet}$) is 0.05~5.

6. The vacuum coating device of claim 5, wherein the nozzle outlet is of a linear slit or a curvilinear slit.

7. The vacuum coating device of claim 5, wherein the nozzle is made of graphite, ceramic or metal.

8. The vacuum coating device of claim 1, wherein a ratio of a length between opposite sides of the flow suppression plate to a length of the inner wall of the flow distribution box is 0.1~0.4.

9. A vacuum coating device, comprising:
a crucible;
an induction heater provided on a periphery of the crucible;
a flow distribution box connected to a top of the crucible via a steam pipe, wherein the flow distribution box is provided inside with a horizontal pressure stabilizing plate, a top of the flow distribution box is connected with a nozzle, the steam pipe is provided with a pressure regulating valve;
the pressure stabilizing plate has a multi-hole structure, a lower surface of the pressure stabilizing plate is connected to a horizontal flow suppression plate, and a space is formed between a side of the flow suppression plate and an inner wall of the flow distribution box;
a jet moderating zone is formed between a joint where the flow distribution box and the steam pipe are connected and the lower surface of the pressure stabilizing plate, and a jet accelerating zone is formed between an upper surface of the pressure stabilizing plate and a joint where the flow distribution box and the nozzle are connected, wherein the holes in the pressure stabilizing plate are rectangular, circle or triangular in shape, and run in linear, curvilinear direction or in a multilayer structure, and wherein the nozzle has a nozzle outlet, a ratio of a total area of holes on the pressure stabilizing plate ($S_{holes}$) to an area of the nozzle outlet ($S_{outlet}$) is 0.1 or more, that is, $S_{holes}/S_{outlet} \geq 0.1$.

10. The vacuum coating device of claim 9, wherein the pressure stabilizing plate has a T-shaped section, wherein ends along a horizontal direction of the pressure stabilizing plate are connected to the inner wall of the flow distribution box, and an end along a vertical direction of the pressure stabilizing plate is connected to the flow suppression plate.

11. The vacuum coating device of claim 9, wherein a ratio of a volume of the jet moderating zone ($V_1$) to a volume of the jet accelerating zone ($V_2$) is 1~5.

12. The vacuum coating device of claim 9, wherein the nozzle outlet is of a slit shape or multi-hole, and the ratio of an area of the nozzle outlet ($S_{outlet}$) to an area of a joint between the steam pipe and the top of the crucible ($S_{inlet}$) is 0.05~5.

13. The vacuum coating device of claim 12, wherein the nozzle outlet is of a linear slit or a curvilinear slit.

14. The vacuum coating device of claim 12, wherein the nozzle is made of graphite, ceramic or metal.

* * * * *